United States Patent [19]

Fulford, Jr. et al.

[11] Patent Number: 5,498,577
[45] Date of Patent: Mar. 12, 1996

[54] METHOD FOR FABRICATING THIN OXIDES FOR A SEMICONDUCTOR TECHNOLOGY

[75] Inventors: H. Jim Fulford, Jr., Austin; Mark I. Gardner, Cedar Creek, both of Tex.

[73] Assignee: Advanced Micro Devices, Inc., Sunnyvale, Calif.

[21] Appl. No.: 280,416

[22] Filed: Jul. 26, 1994

[51] Int. Cl.$^6$ .................................................. H01L 21/02
[52] U.S. Cl. ...................... 437/228; 156/657.1; 437/238
[58] Field of Search ............................. 156/657.1, 659.11, 156/662.1; 437/10, 43, 52, 235, 238, 239, 247, 931, 934, 976, 979, 983

[56] References Cited

U.S. PATENT DOCUMENTS

| | | | |
|---|---|---|---|
| 3,945,856 | 3/1976 | Koenig et al. | 148/1.5 |
| 4,329,773 | 5/1982 | Giepel, Jr. et al. | 29/571 |
| 4,517,732 | 5/1985 | Oshikawa | 29/571 |
| 4,567,645 | 2/1986 | Cavanagh et al. | 29/576 |
| 4,774,197 | 9/1988 | Haddad et al. | 437/27 |
| 4,784,975 | 11/1988 | Hofmann et al. | 437/247 |
| 4,894,353 | 1/1990 | Ibok | 437/239 |
| 5,057,463 | 10/1991 | Bryant et al. | 437/238 |
| 5,077,230 | 12/1991 | Woo et al. | 437/43 |
| 5,208,173 | 5/1993 | Yamada et al. | 437/43 |
| 5,210,056 | 5/1993 | Pong et al. | 437/239 |
| 5,215,934 | 6/1993 | Tzeng | 437/43 |
| 5,219,774 | 6/1993 | Vasch″ | 437/238 |
| 5,225,355 | 7/1993 | Sugino et al. | 437/10 |
| 5,225,361 | 7/1993 | Kakiuchi et al. | 437/43 |
| 5,296,411 | 3/1994 | Gardner et al. | 437/238 |
| 5,316,981 | 5/1994 | Gardner et al. | 437/235 |
| 5,362,685 | 11/1994 | Gardner et al. | 437/238 |

FOREIGN PATENT DOCUMENTS 0148088  2/1992  Japan ................................ 437/238

OTHER PUBLICATIONS

Paper entitled: "Vertically Scaled, High Reliability EEPROM Devices with Ultra–Thin Oxynitride Films Prepared by RTP in $N_2O/O_2$ Ambient" by Umesh Sharma, et al., as published in the Technical Digest of the International Electron Devices Meeting of Dec. 13–16, 1992, pp. IEDM 92–461–464.

Paper entitled: "High Performance Scaled Flash–Type EEPROMS with Heavily Oxynitrided Tunnel Oxide Films" by H. Fukuda, et al, as published in the Technical Digest of the International Electron Devices Meeting of Dec. 13–16, 1992, pp. IEDM 2–465–468.

*Primary Examiner*—William Powell
*Attorney, Agent, or Firm*—Skjerven, Morrill, MacPherson, Franklin & Friel; Andrew C. Graham

[57] ABSTRACT

In one embodiment a high-quality tunnel oxide suitable for programmable devices, such as EEPAL devices, is formed upon a surface region of a semiconductor body over a heavily-doped N+layer, and a gate oxide is formed over a gate region, by first oxidizing the semiconductor body to form an initial oxide layer upon the surface region of the semiconductor body over the heavily-doped N+layer and upon the surface of the gate region. Next, at least a portion of the initial oxide layer overlying the heavily-doped N+layer is removed. The semiconductor body is then exposed to an environment suitable for oxidation, to thicken the remaining portions of the initial oxide, thereby forming the gate oxide, and to form the tunnel oxide over the heavily doped N+layer. A concentration of nitrogen is introduced into both gate and tunnel oxides by introducing the semiconductor body to a source of nitrogen.

33 Claims, 2 Drawing Sheets

METHOD FOR FABRICATING THIN OXIDES FOR A SEMICONDUCTOR TECHNOLOGY

BACKGROUND OF THE INVENTION

1. Field of the Invention

This invention relates to the fabrication of semiconductor devices, and more specifically, to methods for achieving high quality oxides on the surface of a semiconductor substrate.

2. Description of Related Art

The importance of high quality oxides in the fabrication of semiconductor devices cannot be over-emphasized. Many broad categories of commercial devices, such as Electrically Erasable Programmable Array Logic (EEPAL) devices, Electrically Erasable Programmable Read-Only Memories (EEPROMS), Dynamic Random Access Memories (DRAMs), and more recently, even high-speed basic logic functions, owe their commercialization to the reproducibility of high quality, very thin oxide layers.

Major improvements in gate oxide quality have been achieved by improved cleaning techniques, the addition of HCL/TCA to the gate oxidation process, and higher purity gasses and chemicals. RCA cleaning techniques are described in "Dependence of Thin Oxide Quality on Surface Micro-Roughness" by T. Ohmi, et. al., IEEE Transactions on Electron Devices, Vol. 39, Number 3, March 1992. Other techniques have incorporated different gas ($NH_3$, ONO, WET $O_2$) schemes in the gate oxidation cycle other than the conventional $O_2$ with HCL or TCA. Also considerable progress has been made with single wafer RTA (RTP) gate processing, as is described in "Effect of Rapid Thermal Reoxidation on the Electrical Properties of Rapid Thermally Nitrided Thin-Gate Oxides" by A Joshi, et al , IEEE Transactions on Electron Devices, Vol. 39, Number 4, Apr. 1992.

These techniques refer to "gate oxides" as in the gate of an MOS transistor, but are usually applicable to any thin (usually less than 300Å) oxide. The "tunnel" oxide of an EEPAL process technology is a very thin gate oxide (usually less than 100Å), with the somewhat unusual requirement that it be grown above a very heavily doped N+ layer. Oxides grown from heavily doped substrate surfaces are generally considered to be lower in quality than those grown from more lightly doped surfaces, as would be the case for the transistor channel region of most MOS transistor processes.

Despite the care taken in forming thin oxides, further quality improvement is desirable. Moreover, even thinner oxides are desirable for new devices, and must have similarly high quality oxide characteristics.

SUMMARY OF THE INVENTION

It is an object of the present invention to improve the quality of a very thin oxide layer.

It is an additional object of the present invention to improve the quality of a tunnel oxide for a programmable technology, such as an EEPAL.

It is a further object of the present invention to improve the quality of a gate oxide for an MOS transistor.

It is yet a further object of the present invention to provide an environment for forming a thin oxide using a relatively low oxidation temperature.

It is still a further object of the present invention to produce high quality, highly manufacturable and reproducible thin oxides, especially those having thicknesses in the range from 25–75Å.

In one embodiment of the present invention for an integrated circuit fabrication process, a method for forming a first oxide layer upon a first surface region of a semiconductor body, and further for forming a second oxide layer, of greater thickness than the first oxide layer, upon a second surface region of the semiconductor body, includes the step of forming an initial oxide layer upon the first and second surface regions. The method then includes the step of removing at least a portion of the initial oxide layer in a region disposed above the first surface region of the semiconductor body, followed by the step of exposing the semiconductor body to an environment suitable for oxide formation, to form a first oxide layer disposed above the first surface region of the semiconductor body and to thicken the initial oxide layer disposed above the second surface region, thus forming the second oxide layer. The method includes the step of introducing, subsequent to the commencement of the exposing step, the semiconductor body to a source of nitrogen, to form a concentration of nitrogen in both the first and second oxide layers.

In another embodiment of the current invention, the introducing step is performed simultaneously with the exposing step, whereby the environment suitable for oxide formation includes a source of nitrogen during at least a portion of the exposing step, to form a concentration of nitrogen in at least a portion of both the first and second oxides.

In yet another embodiment of the current invention, the method further includes the additional step, subsequent to the exposing and introducing steps, of annealing the semiconductor body.

Alternatively, in still yet another embodiment of the current invention, the introducing step comprises the step of annealing the semiconductor body, subsequent to the exposing step, under an ambient containing nitrogen, to form a surface layer in both the first and second oxides containing a concentration of nitrogen

DETAILED DESCRIPTION OF THE PREFERRED EMBODIMENTS

FIGS. 1–6 are cross-sectional views illustrating a sequence of process steps for forming gate and tunnel oxides in a P-well active area of a CMOS EEPAL process. Such views are also applicable to other similar processes, such as those for certain CMOS EEPROMs. The gate oxide is used to fabricate N-channel MOS transistors, and the tunnel oxide is used to fabricate a structure useful to an EEPAL cell element.

Figure 1:
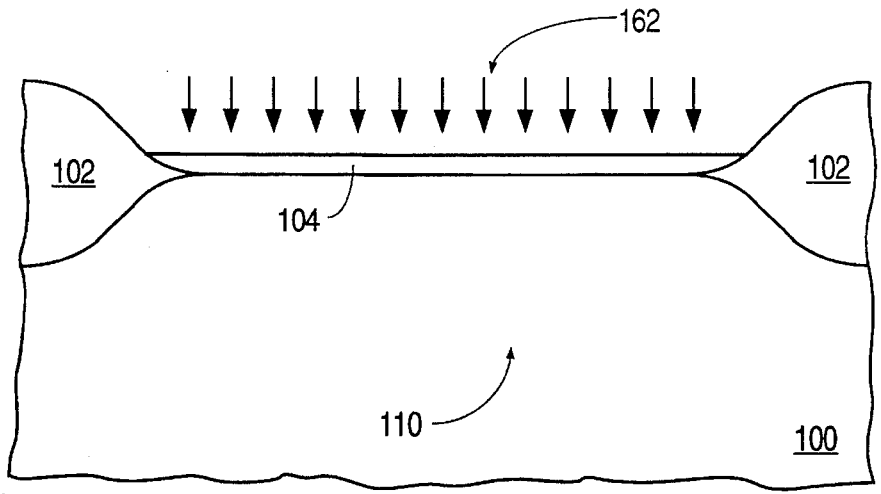
FIGS. 1–6 are cross-sectional views illustrating a sequence of process steps for forming gate and tunnel oxides in a P-well active area of a CMOS EEPAL process.

Referring to FIG. 1, P-well field oxides 102 are formed using a LOCOS process upon substrate 100. P-well field oxides 102 define a P-well active area 110 between the field oxides 102. KOOI oxide 104 then is grown in a steam oxidation environment to a thickness of approximately 225Å. The growing and subsequent removing of KOOI oxide is a well known procedure for eliminating the remnant KOOI ribbon of nitride which forms around the active area at the LOCOS edge during the previous field oxidation. (Silicon nitride in a steam oxidation environment decomposes into ammonia and silicon dioxide. The ammonia diffuses down through the field oxide until reaching the silicon surface, where it reacts to form a silicon nitride, and leaving a ribbon of nitride at the silicon/silicon dioxide interface around the edge of the active area.)

$V_{TI}$ Implant 162 is then implanted over the whole wafer to set the nominal threshold of MOS transistors to be fabricated later in the P-wells. This is preferably a light boron implant which is applied without any masking photoresist (i.e. a "blanket implant") to both P-well regions and N-well regions (not shown). A preferable implant dose is $0.4$-$2.0 \times 10^{12}$ ions/cm$^2$ at an implant energy of 25 keV. A separate $VT_{TP}$ implant (not shown) is then implanted into the N-well regions (not shown) to adjust the threshold of P-channel MOS transistors to be fabricated later in the N-wells. To accomplish this, a photoresist layer is applied and defined to cover the P-wells while exposing the N-wells, the implant into the N-wells is performed (typically with an implant dose of $4 \times 10^{11}$ ions/cm$^2$ at an implant energy of 25 keV), and the photoresist overlying the P-wells then removed.

Figure 2:
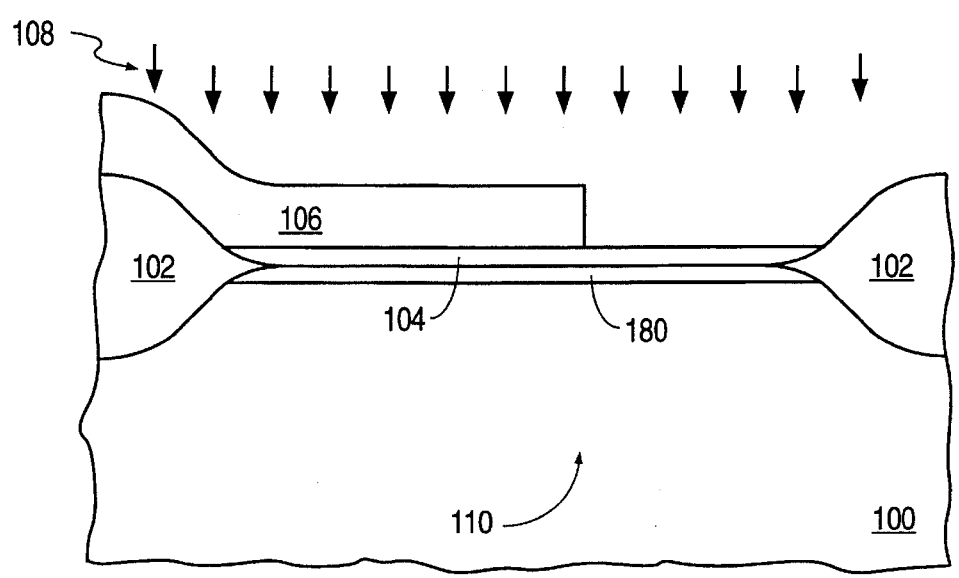
Figure 3:
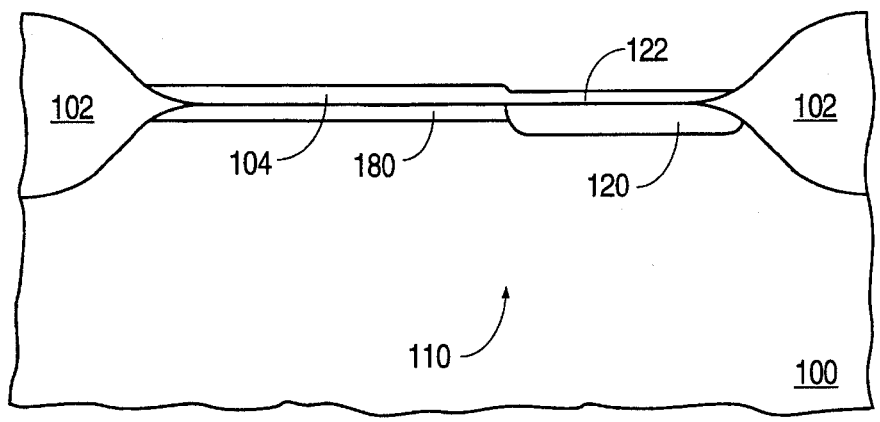

Continuing with the process sequence as affects the P-well shown, a photoresist layer is applied and defined to form photoresist layer 106 which exposes a portion of the KOOI oxide 104 over the P-well active area 110. The resulting structure is shown in FIG. 2. The as-yet unactivated $V_{TI}$ implant layer 180 is shown under the KOOI oxide 104.

Next, a phosphorus implant 108 is implanted through the exposed KOOI oxide and into the substrate 100 in the P-well active area 110 for the EEPAL process of this embodiment. A preferable implant dose is $1.0 \times 10^{15}$ ions/cm$^2$ at an implant energy of 60 keV. Other regions of the substrate are masked by the photoresist layer 106. Photoresist layer 106 is then removed and the surface is prepared for annealing by an RCA clean operation, resulting in the structure shown in FIG. 3. Phosphorus implant layer 120 has been created by the heavy dose of the phosphorus implant 108. Due to the implant damage to the KOOI oxide which was exposed to the phosphorus implant 108, the RCA clean operation etches some of the implant-damaged KOOI oxide, resulting in etched KOOI oxide 122 approximately 100 Å thick in the region above phosphorus implant layer 120. The portion of the KOOI oxide 104 which was formerly protected by photoresist layer 106 and consequently not damaged by phosphorus implant 108 remains substantially unetched at 225 Å thick. $V_{TI}$ implant layer 180 is not shown extending into phosphorus implant layer 120 because the doping density of phosphorus implant layer 120 is far greater than that of $V_{TI}$ implant layer 180.

Figure 4:
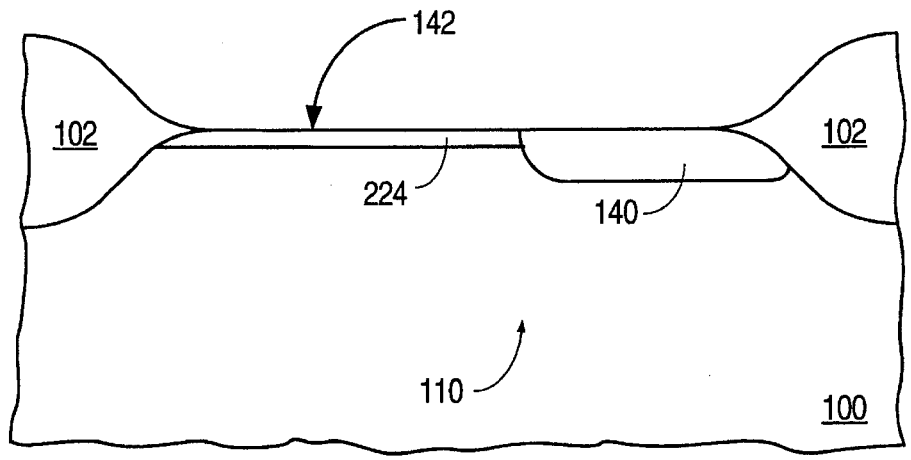

An anneal operation follows which drives the phosphorus implant layer 120 into the substrate 100, thereby lowering the surface concentration of phosphorus. Moreover, the anneal operation activates the phosphorus implant, thereby forming an N+layer in the P-well, and activates the $V_{TI}$ implant layer 180, thereby forming a $V_{TI}$ layer. Next, a short oxide etch (e.g., 1.7 minutes in 10:1 HF) removes the remaining KOOI oxide 104 and etched KOOI oxide 122 from the surface of the P-well in preparation for gate oxidation. Preferable etch conditions for such a pre-gate oxidation etch step are discussed in copending, commonly-assigned U.S. patent application Ser. No. 07/969,708, filed on Oct. 29, 1992, U.S. Pat. No. 5,362,685, which names Mark I. Gardner, Henry Jim Fulford, Jr., and Jay J. Seaton as inventors and is entitled "Method for Achieving a High Quality Thin Oxide in Integrated Circuit Devices" now U.S. Pat. No. 5,362,685 issued on Nov. 8, 1994 which application is incorporated herein by reference in its entirety. The resulting structure is shown in FIG. 4, and shows P-well active area surface 142 free of overlying oxide, and further shows the formation of N+ layer 140, being deeper and broader than the previous unactivated phosphorus implant layer 120, due to the drive in accomplished during the previous anneal step. Moreover, the unactivated $V_{TI}$ implant layer 180 has been activated by the anneal step, resulting in $V_{TI}$ layer 224.

Next, a gate oxide is formed over the P-well active area 110. This is preferably grown in a dry oxidation environment to a 140 Å thickness, but alternatively may be deposited by a CVD process (discussed below). An in-situ anneal is preferably performed at the conclusion of the gate oxidation cycle by changing the ambient gases in the oxidation furnace to an inert annealing ambient, while continuing to apply a high temperature (e.g., 1000° C. for 30 minutes in Argon). Several advantageous gate oxidation conditions are discussed in commonly-assigned U.S. Pat. No. 5,316,981, issued on May 31, 1994, which names Mark I. Gardner and Henry Jim Fulford, Jr. as inventors and is entitled "Method for Achieving a High Quality Thin Oxide Using a Sacrificial Oxide Anneal", which patent is incorporated herein by reference in its entirety.

Figure 5:
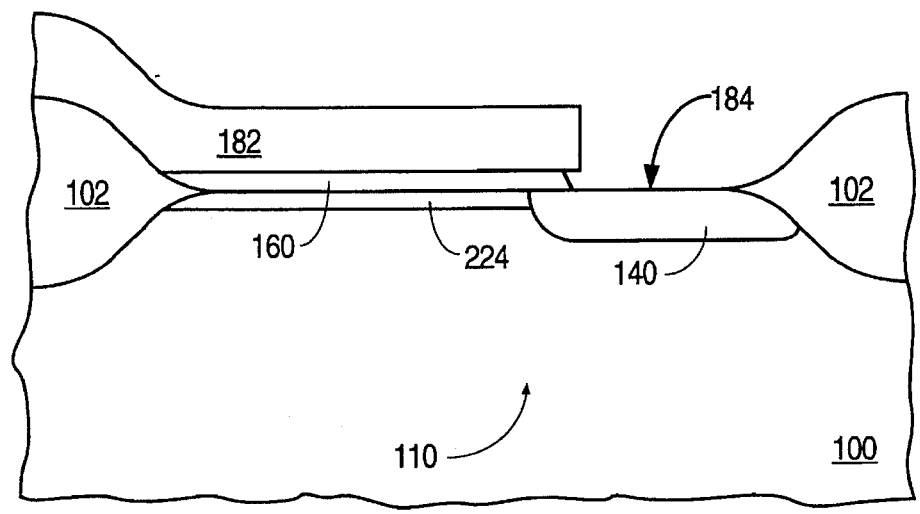

Continuing with the process sequence as affects the P-well shown, a photoresist layer is applied and defined to expose the gate oxide over the N+ layer 140, followed by an etch step to remove the exposed gate oxide. This Tunnel Opening etch may be a 0.2 minute etch in a 6:1 buffered oxide etchant, and removes the 140 Å of gate oxide to expose the surface of the substrate over the N+ layer 140. Preferable conditions for this etch are discussed in the above-referenced patent application entitled "Method for Achieving a High Quality Thin Oxide in Integrated Circuit Devices" (Ser. No. 07/969,708). The resulting structure is shown in FIG. 5 and shows the N+surface 184 exposed by the tunnel opening etch. Photoresist layer 182 defines the tunnel opening and protects the remainder of gate oxide 160 not overlying N+ layer 140. The $V_{TI}$ layer 224 is shown disposed under the gate oxide 160.

Figure 6:
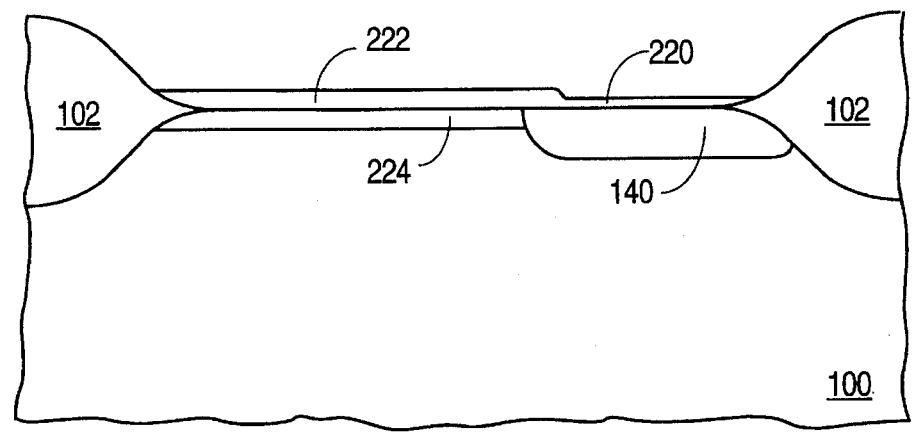

Lastly, the photoresist layer 182 is removed and an oxidation sequence as described hereinafter both grows a tunnel oxide upon N+surface 184 overlying N+ layer 140, and increases the thickness of the existing gate oxide 160. Referring to FIG. 6, tunnel oxide 220 may be nominally 85 Å thick, while re-oxidized gate oxide 222 may be nominally 180 Å thick. Tunnel oxides from 60–90 Å and gate oxides from 100–180 Å may be easily achieved using similar sequences to those described below. In an alternate embodiment, the tunnel opening etch may only partially remove (not shown) the gate oxide 160 overlying N+ layer 140, which is then subsequently thickened by the tunnel oxidation sequence to form the tunnel oxide.

Subsequent to this step a polysilicon layer is deposited, doped, and defined to form, in accordance with any of a variety of well-known processes, transistors, interconnect, and other features. In particular, the polysilicon is deposited above tunnel oxide 220 to form a structure useful to an EEPAL cell which conducts current through tunnel oxide 220 if the electric field across the tunnel oxide 220 is high enough. Measurements of oxide quality can be made immediately after the polysilicon layer is patterned into useful structures.

The oxidation sequence shown in Table 1 may be used to both grow a tunnel oxide from N+surface 184 overlying N+ layer 140, and to increase the thickness of the existing gate oxide 160. As is shown, the tunnel oxidation proceeds as an oxidation stage, followed by a ramp-down in temperature, and then by an RTP anneal (a "rapid thermal process" anneal, which is also known as an "RTA anneal", and as a "rapid thermal anneal") in a nitrogen ambient. This sequence typically produces a tunnel oxide 220 having a nominal thicknes of 85 Å.

TABLE 1

Tunnel oxidation sequence

| STEP | GASSES | TEMP | TIME |
|---|---|---|---|
| I. Push/Stabilize | Ar | Ramp to 800° C. Final Temp | t = 28 min. |
| II. Ramp to 850 | Low $O_2$/Ar | 850° C. Final Temp | t = 10 min. |
| III. Oxidation | $O_2$ | 850° C. | t = 5 min. |
| IV. Ramp to 800 | $N_2$ or Ar | 800° C. Final Temp | t = 16 min. |
| V. Pull/Stabilize | $N_2$ or Ar | less than 500° C. | t = 31 min. |
| VI. RTP anneal | $N_2O$ | 1050° C. | t = 10 sec. |

Alternately, an oxidation sequence as described in Table 2 may be used to both grow a tunnel oxide from N+ surface 184 overlying N+ layer 140, and to increase the thickness of the existing gate oxide 160. As is shown, the tunnel oxidation proceeds as a three-stage oxidation cycle, with HCl gettering performed between the first and second stages, and again between the second and third stages. This procedure keeps the HCl away from both the silicon and the polysilicon interfaces, while still providing a high enough HCl concentration within the body of the gate oxide to getter any mobile ionic charge or heavy metals that may be present. HCl coming into contact with either a silicon or polysilicon interface will degrade that interface surface, and likewise degrade any oxide contiguous to that surface. Additionally, the gettering steps provide an annealing environment for the partially-grown oxide which serves to reduce roughness at the Si/$SiO_2$ interface and to densify the oxide, both of which are useful in promoting a high quality oxide. After the third stage of oxidation and a ramp-down in temperature, a rapid thermal anneal (RTP anneal, and also known as an "RTA anneal", even though technically redundant terminology) may be optionally performed in an $N_2O$ ambient environment. The $N_2O$ anneal step may form approximately another 15 Å of oxide, resulting in a final thickness of approximately 75 Å. Steps I–IX of Table 2, which include the oxidation and

TABLE 2

75Å Tunnel Oxidation Sequence

| STEP | GASSES | TEMP | TIME |
|---|---|---|---|
| I. Push/ramp to 800° C. | Ar | Ramp to 800° C. Final Temp | t = 28 min. |
| II. Ramp to 850 | Low $O_2$/Ar | 850° C. Final Temp | t = 10 min. |
| III. Oxidation | $O_2$ | 850° C. | t = 12 min. |
| IV. HCL Getter | HCl/Ar | 850° C. | t = 5 min. |
| V. Oxidation | $O_2$ | 850° C. | t = 2.0 min. |
| VI. HCL Getter | HCl/Ar | 850° C. | t = 5 min. |
| VII. Oxidation | $O_2$ | 850° C. | t = 2.0 min. |
| VIII. Ramp to 800 | $N_2$ or Ar | 800° C. Final Temp | t = 16 min. |
| IX. Pull/stabilize | $N_2$ or Ar | less than 650° C. | t = 31 min. |
| X. RTP anneal | $N_2O$ | 1050° C. | t = 10 sec. | gettering steps, are preferably performed in a diffusion tube, while step X is, of course, preferably performed in an RTP system. Nonetheless, the final anneal (step X) can also be performed in a diffusion tube, if desired. Earlier doping profiles may need to be adjusted due to the high thermal mass of the tube and the resultant additional time at high temperature a wafer would experience compared to an RTP anneal.

Many of the specific steps described above may be performed using a variety of different process steps. For example, the gate oxide may be advantageously formed by either a low-pressure chemical vapor deposition (LPCVD) process, a plasma-enhanced chemical vapor deposition (PECVD) process, a rapid thermal process (RTP), or a furnace process as described above. Similarly, the tunnel oxide may be advantageously formed by either a LPCDV, PECVD, RTP, or furnace process. Both oxide formations may be performed in either a $N_2O$ or $O_2$ ambient, and may or may not include the introduction of Cl into the oxide. Moreover, the nitrogen anneal may be advantageously performed in either a PECVD process, an RTP process, or in a conventional furnace process. Other oxidation sequences involving nitrogen are are discussed in commonly-assigned U.S. Pat. No. 5,296,411, issued on Mar. 22, 1994, which names Mark I. Gardner and Henry Jim Fulford, Jr. as inventors and is entitled "Method for Achieving an Ultra-Reliable Thin Oxide Using a Nitrogen Anneal", which patent is incorporated herein by reference in its entirety.

The basic process sequence as described in Table 2 may be utilized to produce oxides down to approximately 60 Å thick. To obtain thickness in the 30–40 Å range, the temperature of the sequence must be lowered to 800° C. Table 3 discloses a tunnel oxidation sequence useful for producing a 40 Å tunnel oxide, and is preferably performed in a furnace tube and followed by an RTP anneal (not shown in the table). Such an RTP anneal, which can range from a temperature of 900°–1050° C., ensures a high quality oxide even though grown at a low furnace temperature. In contrast with the process shown in Table 2, no low $O_2$ is used in the tunnel oxidation cycle shown in Table 3.

TABLE 3

40Å Tunnel Oxidation Sequence

| STEP | GASSES | TEMP | TIME |
|---|---|---|---|
| I. Push/ramp | Ar | Ramp to 800° C. Final Temp | t = 28 min. |
| II. Stabilize to 800 | Ar | 800° C. Final Temp | t = 5 min. |
| III. Oxidation | $O_2$ | 800° C. | t = 8 min. |
| IV. HCL Getter | HCl/Ar | 800° C. | t = 1.0 min. |
| V. Oxidation | $O_2$ | 800° C. | t = 2.5 min. |
| VI. HCL Getter | HCl/Ar | 800° C. | t = 1.0 min. |
| VII. Oxidation | $O_2$ | 800° C. | t = 2.5 min. |
| VIII. Ramp to 800 | Ar | 800° C. | t = 16 min. |
| IX. Pull/stabilize | Ar | less than 650° C. | t = 31 min. |

The tunnel oxidation sequence disclosed in Table 4 may be used to produce a 30 Å oxide. Similarly to the process of Table 3, and in contrast with the process shown in Table 2, no low $O_2$ is used in the tunnel oxidation cycle shown in Table 4. Even lower furnace temperatures of 700°–750° C., followed by an RTP anneal, should allow 20–25 Å tunnel oxides to be produced.

Rather than an RTP anneal, the tunnel oxide may be produced by following a furnace growth with an LPCVD anneal under a low pressure ambient of $N_2O$. Typical pressures range from 5–30 torr, while typical temperatures range from 900° to 1050° C.

TABLE 4

30Å Tunnel Oxidation Sequence

| STEP | GASSES | TEMP | TIME |
|---|---|---|---|
| I. Push/ramp | Ar | Ramp to 800° C. Final Temp | t = 28 min. |
| II. Stabilize to 800 | Ar | 800° C. Final Temp | t = 5 min. |
| III. Oxidation | $O_2$ | 800° C. | t = 5 min. |
| IV. HCL Getter | HCl/Ar | 800° C. | t = 1.0 min. |
| V. Oxidation | $O_2$ | 800° C. | t = 1.0 min. |
| VI. HCL Getter | HCl/Ar | 800° C. | t = 1.0 min. |
| VII. Oxidation | $O_2$ | 800° C. | t = 1.0 min. |
| VIII. Ramp to 800 | Ar | 800° C. | t = 16 min. |
| IX. Pull/ stabilize | Ar | less than 650° C. | t = 31 min. |

The tunnel oxidation may also be accomplished by utilizing an LPCVD process rather than by a furnace oxidation process. Such a process may be performed at a temperature in the range of 700° to 850° C., and may use a mixture of $N_2O$ and $SiH_4$ having a ratio in the range from 2:1 to 10:1, and may be performed at a pressure in the range from 100 mTorr to 500 mTorr. One notable advantage of this process is the ability to be performed in a conventional polysilicon deposition system. Further, the LPCVD oxidation may optionally be followed by either an RTP or furnace anneal.

The tunnel oxidation may also be accomplished by utilizing an PECVD process rather than by a furnace oxidation process or by an LPCVD process. Such a process may also use a mixture of $N_2O$ and $SiH_4$ having a ratio in the range from 2:1 to 10:1, may be performed at a pressure in the range from 2 Torr to 30 Torr, and may be performed at a power level in the range from 50–500 Watts. Since the energy required for dissociation of the $N_2O$ $SiH_4$ molecule is contained in the plasma, the process may be performed at a temperature in the range from room temperature (25° C.) to 400° C. Further, the LPCVD oxidation may optionally be followed by either an RTP or furnace anneal.

If the gate oxide is deposited, rather than grown, a much thinner oxide is achievable. For example, a 10–20 Å gate oxide may be deposited, followed by a tunnel oxidation. This results in a gate oxide very similar in thickness to the tunnel oxide. Such a gate oxidation may be accomplished by either an LPCVD or PECVD process.

The techniques thus described have far reaching implications for any oxidation cycle prior to polysilicon deposition for producing high quality, very thin oxides, and have tremendous potential application to most all MOS process technologies. It is believed that the techniques are particularly suited to improving the quality of deposited oxides and, as illustrated in the sequence of FIG. 1–6 in forming the gate oxide, for re-grown oxides. A deposited oxide is potentially useful for forming a tunnel oxide less than 50 Å A thick, rather than growing the oxide as discussed above.

It is also believed that a concentration of nitrogen in the oxide provides a diffusion barrier to reduce the migration of dopant atoms, particularly boron, from an overlying polysilicon layer down through the oxide to the channel or substrate region below the oxide, which could degrade the performance of a device using the oxide (by significantly altering the doping profile of the substrate region). This diffusion barrier is particularly attractive when boron is present, because boron diffuses through oxide faster than either phosphorus or arsenic. A source of nitrogen in the oxide layer can be provided by the $N_2O$ anneal as described above, or alternatively by other gases, such as NO, $NH_3$, $NH_4$, or $NF_3$, typically in combination with a source of oxygen, such as $O_2$.

Furthermore, the nitrogen can be introduced earlier in the oxidation process than a final anneal. For example, it is believed that nitrogen may be introduced during the gettering operations, and yield an oxide having similar quality improvements as the oxides discussed above, even if the final anneal is only under an inert ambient, such as Argon. The nitrogen may also be introduced during some or all of the growth steps themselves, albeit requiring re-calibration of the optimal growth conditions necessary to yield an oxide of the desired thickness.

While the above descriptions reference an EEPAL technology fabricated in a CMOS technology, the teachings of this disclosure can be advantageously applied to other semiconductor process technologies incorporating thin oxides. For example, a DRAM process requiring capacitors fabricated with very thin oxide dielectrics could benefit greatly from these teachings. Certainly other programmable technologies utilizing tunnel oxides are beneficiaries as well.

While the invention has been described with respect to the embodiments set forth above, the invention is not necessarily limited to these embodiments. For example, the invention is not necessarily limited to any particular transistor process technology. Moreover, variations in certain of the process steps can be practiced. For example, a wide variety of gate oxide and tunnel oxide thickness may be produced, and whether to anneal and/or how to anneal the two oxides may be decided in a number of different ways. Accordingly, other embodiments, variations, and improvements not described herein are not necessarily excluded from the scope of the invention, which is defined by the following claims.

We claim:

1. In an integrated circuit fabrication process, a method for forming a first oxide layer upon a first surface region of a semiconductor body, and further for forming a second oxide layer, of greater thickness than the first oxide layer, upon a second surface region of the semiconductor body, comprising the steps of:

forming an initial oxide layer upon the first and second surface regions of the semiconductor body;

removing at least a portion of the initial oxide layer in a region disposed above the first surface region of the semiconductor body;

exposing, subsequent to the removing step, the semiconductor body to an environment suitable for oxide formation, to form a first oxide layer disposed above the first surface region of the semiconductor body and to thicken the initial oxide layer disposed above the second surface region, thus forming the second oxide layer; and introducing, subsequent to the commencement of the exposing step, the semiconductor body to a source of nitrogen, to form a concentration of nitrogen in both the first and second oxide layers.

2. A method as in claim 1 wherein the removing step comprises the complete removal of the initial oxide within the region disposed above the first surface region, thus exposing the first surface region of the semiconductor body.

3. A method as in claim 1 wherein the removing step comprises the partial removal of the initial oxide within the region disposed above the first surface region, thus leaving a remaining portion of the initial oxide, of lesser thicknes than its thickness at the completion of the forming step, disposed above the first surface region of the semiconductor body.

4. A method as in claim 1 further comprising, subsequent to the removing step and prior to the exposing step, the additional step of thinning the initial oxide layer disposed above the second surface region of the semiconductor body.

5. A method as in claim 1 wherein the initial oxide layer disposed above the second surface region of the semiconductor body is of a thickness, just prior to the exposing step, substantially unchanged as compared to its thickness at the completion of the forming step.

6. A method as in claim 1 wherein the first surface region of the semiconductor body is disposed overlying a heavily-doped layer of the semiconductor body.

7. A method as in claim 1 wherein the introducing step comprises the step of annealing the semiconductor body, subsequent to the exposing step, under an ambient containing nitrogen, to form a surface layer in both the first and second oxides containing a concentration of nitrogen.

8. A method as in claim 7 wherein the annealing step comprises an RTP annealing step and wherein the exposing step comprises a furnace growth step.

9. A method as in claim 7 wherein the annealing step comprises an LPCVD annealing step and wherein the exposing step comprises a furnace growth step.

10. A method as in claim 9 wherein the LPCVD annealing step is performed at a temperature in the range from 900° C. to 1050° C.

11. A method as in claim 9 wherein the LPCVD annealing step is performed at a pressure in the range from 5 torr to 30 torr.

12. A method as in claim 1 further comprising, subsequent to the exposing and introducing steps, the step of annealing the semiconductor body.

13. A method as in claim 12 wherein the annealing step comprises an RTP annealing step and wherein the exposing step comprises a furnace growth step.

14. A method as in claim 13 wherein the RTP annealing step is performed at a temperature in the range from 900° C. to 1050° C.

15. A method as in claim 13 wherein the furnace growth step is performed at a temperature in the range from 700° C. to 950° C.

16. A method as in claim 13 wherein the furnace growth step is performed at a temperature in the range from 800° C. to 850° C.

17. A method as in claim 12 wherein the annealing step comprises an LPCVD annealing step and wherein the exposing step comprises a furnace growth step.

18. A method as in claim 1 wherein the introducing step is performed simultaneously with the exposing step, wherein the environment suitable for oxide formation includes a source of nitrogen during at least a portion of the exposing step, to form a concentration of nitrogen in at least a portion of both the first and second oxides.

19. A method as in claim 18 wherein the exposing step comprises an LPCVD exposing step.

20. A method as in claim 19 wherein the environment suitable for oxidation comprises a mixture of $N_2O$ and $SiH_4$ having a ratio in the range from 2:1 to 10:1.

21. A method as in claim 19 wherein the LPCVD exposing step is performed at a pressure in the range from 100 mTorr to 500 mTorr.

22. A method as in claim 19 wherein the LPCVD exposing step is performed at a temperature in the range from 700° C. to 850° C.

23. A method as in claim 18 wherein the exposing step comprises a PECVD exposing step.

24. A method as in claim 23 wherein the environment suitable for oxidation comprises a mixture of $N_2O$ and $SiH_4$ having a ratio in the range from 2:1 to 10:1.

25. A method as in claim 23 wherein the PECVD exposing step is performed at a pressure in the range from 2 Torr to 30 Torr.

26. A method as in claim 23 wherein the PECVD exposing step is performed at a temperature in the range from approximately 25° C. to 400° C.

27. A method as in claim 23 wherein the PECVD exposing step is performed at a power level in the range from 50 W to 500 W.

28. A method as in claim 1 wherein the environment suitable for oxide formation includes a source of HCL during at least a portion of the exposing step, to form a concentration of chlorine in at least a portion of both the first and second oxides.

29. A method as in claim 1 wherein the environment suitable for oxide formation comprises an HCl-free environment during the exposing step, to form both the first and second oxides free from chlorine.

30. A method as in claim 1 wherein the forming step comprises a process chosen from the group consisting of LPCVD, PECVD, RTP, and furnace oxidation processes.

31. A method as in claim 1 wherein the exposing step comprises a process chosen from the group consisting of LPCVD, PECVD, RTP, and furnace oxidation processes.

32. A method as in claim 1 wherein the introducing step comprises a process chosen from the group consisting of PECVD, RTP, and furnace processes.

33. An integrated circuit comprising:

a first oxide layer formed upon a first surface region of a semiconductor body by first forming an initial oxide layer thereupon, removing at least a portion thereof, and then exposing the semiconductor body to an environment suitable for oxide formation;

a second oxide layer formed upon a second surface region of said semiconductor body by first forming an initial oxide layer thereupon, then exposing the semiconductor body to said environment suitable for oxide formation so as to thicken said initial oxide layer, thus creating the second oxide;

wherein both the first and second oxides further comprise at least a respective portion thereof containing nitrogen formed by introducing the semiconductor body to an ambient containing nitrogen.

* * * * *

UNITED STATES PATENT AND TRADEMARK OFFICE
CERTIFICATE OF CORRECTION

PATENT NO. : 5,498,577
DATED : March 12, 1996
INVENTOR(S) : H. Jim Fulford, Jr. and Mark I. Gardner It is certified that error appears in the above-identified patent and that said Letters Patent is hereby corrected as shown below:

Column 3, line 12: Delete "$VT_{TP}$" and insert "$V_{TP}$"

Column 7, line 54: Delete "50Å A" and insert "50Å"

Column 10, line 21: Delete "HCL" and insert "HCl"

Signed and Sealed this

Eighth Day of April, 1997

Attest:

BRUCE LEHMAN

Attesting Officer

Commissioner of Patents and Trademarks